United States Patent
Chang

(10) Patent No.: US 6,642,104 B2
(45) Date of Patent: Nov. 4, 2003

(54) METHOD OF FORMING FLOATING GATE OF FLASH MEMORY

(75) Inventor: Shu-Cheng Chang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/064,077

(22) Filed: Jun. 10, 2002

(65) Prior Publication Data
US 2003/0190784 A1 Oct. 9, 2003

(30) Foreign Application Priority Data
Apr. 8, 2002 (TW) ........................................ 91106950 A

(51) Int. Cl.[7] .......................................... H01L 21/336
(52) U.S. Cl. ........................ 438/257; 438/259; 438/264; 438/266
(58) Field of Search ................... 438/257, 258, 438/259, 260, 263, 262, 264, 265, 266, 424; 257/314, 315, 316, 318, 320, 321, 322

(56) References Cited

U.S. PATENT DOCUMENTS

| 4,753,901 A | * | 6/1988 | Ellsworth et al. ........... 438/427 |
| 6,281,103 B1 | * | 8/2001 | Doan ......................... 438/593 |
| 6,294,812 B1 | * | 9/2001 | Ding et al. ................. 257/321 |
| 2002/0019113 A1 | * | 2/2002 | Chung ........................ 438/424 |

* cited by examiner

Primary Examiner—Jack Chen
(74) Attorney, Agent, or Firm—Jiang Chyun IP Office

(57) ABSTRACT

A method of forming the floating gate of a flash memory unit. A tunnel oxide layer and a first floating gate layer are sequentially formed over a substrate. The first floating gate layer, the tunnel oxide layer and the substrate are patterned to form an opening. A first dielectric layer is formed over the substrate and the interior of the opening but without completely filling the opening. A second dielectric layer is formed over the first dielectric layer so that the opening is completely filled. The second dielectric layer is planarized to expose the first dielectric layer. The first dielectric layer is removed to expose the first floating gate layer. A second floating gate layer is formed over the first floating gate layer. The second floating gate is planarized to expose the second dielectric layer.

11 Claims, 5 Drawing Sheets

METHOD OF FORMING FLOATING GATE OF FLASH MEMORY

CROSS REFERENCE TO RELATED APPLICATIONS

This application claims the priority benefit of Taiwan application serial no.91106950, filed on Apr. 8, 2002.

BACKGROUND OF INVENTION

1. Field of Invention

The present invention relates to a method of manufacturing a semiconductor device. More particularly, the present invention relates to a method of forming the floating gate of a flash memory unit.

2. Description of Related Art

Flash memory is a type of electrical erasable programmable read only memory (EEPROM). Data can be written into or erased from the EEPROM. Most important, however, is that the data is retained even after power supply is cut. Due to versatility of the EEPROM, most personal computer and electronic equipment employ this type of memory. Flash memory is also a type of non-volatile memory (NVM) having the advantages of occupying a small volume, having a fast accessing speed and consuming very little power. Since data inside the flash memory is erased in a block-by block manner, operating speed is exceptionally fast.

FIGS. 1A through 1F are cross-sectional views showing the progression of steps for forming the floating gate of a conventional flash memory. A substrate 100 having a tunnel oxide layer 102 and a first floating gate layer 104 thereon is provided as shown in FIG. 1A.

As shown in FIG. 1B, the first floating gate layer 104, the tunnel oxide layer 102 and the substrate 100 are patterned to form an opening 106 in the substrate 100, a patterned floating gate layer 104a and a patterned tunnel oxide layer 102a.

As shown in FIG. 1C, an oxide layer (not shown) is formed over the first floating gate layer 104a, filling the opening 106 completely. A chemical-mechanical polishing operation is conducted to remove a portion of the oxide layer and expose the first floating gate layer 104a. Hence, a shallow trench isolation region 108 is formed.

As shown in FIGS. 1D and 1E, a second floating gate layer 110 is formed over the first floating gate layer 104a and the shallow trench isolation region 108. Thereafter, a patterned photoresist layer 112 is formed over the second floating gate layer 110. The photoresist layer 112 exposes the second floating gate layer 110 above the shallow trench isolation region 108.

As shown in FIG. 1F, using the photoresist layer 112 as an etching mask, a portion of the second floating gate layer 110 is removed to form a patterned second floating gate layer 110a. The patterned first floating gate layer 104a and the patterned second floating gate layer 110a together constitute a floating gate 114 of a flash memory unit. The floating gate of each flash memory unit is isolated from the others through the shallow trench isolation regions 108.

As the level of integration for integrated circuits continues to rise, dimensions of each device shrink. Hence, narrower areas have to be set aside for forming the shallow trench isolation regions. Because the conventional method of forming the floating gate of a flash memory relies on simple photolithographic processes, line width and alignment is severely restricted. In other words, if the opening pattern in the photoresist layer 112 is not accurately aligned with the shallow trench isolation regions 108, the second floating gate layer 110a and the first floating gate layer 104a may not align with each other. When this is the case, the shallow trench isolation regions 108 may not fully isolate the floating gate 114 of each memory cell from each other.

SUMMARY OF INVENTION

Accordingly, one object of the present invention is to provide a method of forming the floating gate of a flash memory unit capable of averting the problem caused by a deviation of floating gate alignment.

A second object of this invention is to provide a method of forming the floating gate of a flash memory unit capable of minimizing the effects due to a reduction of device line width and the limitations of photolithographic process resulting from a reduction in device dimensions.

A third object of this invention is to provide a method of forming the floating gate of a flash memory unit capable of aligning the floating gates and the shallow trench isolation regions together automatically.

To achieve these and other advantages and in accordance with the purpose of the invention, as embodied and broadly described herein, the invention provides a method of forming the floating gate of a flash memory unit. A tunnel oxide layer and a first floating gate layer are sequentially formed over a substrate. The first floating gate layer, the tunnel oxide layer and the substrate are patterned to form an opening. A first dielectric layer is formed over the substrate partially filling the opening. A second dielectric layer is formed over the first dielectric layer totally filling the opening. A high etching selectivity ratio exists between the second dielectric layer and the first dielectric layer. A chemical-mechanical polishing operation is conducted to planarize the second dielectric layer and expose the first dielectric layer. Thereafter, a wet etching operation is conducted to remove a portion of the first dielectric layer and expose the first floating gate layer, thereby forming a shallow trench isolation region. The first dielectric material layer surrounds the shallow trench isolation regions. The second dielectric material layer occupies the central portion of the shallow trench isolation regions. Since the second dielectric layer has an etching rate lower than the first dielectric layer, a portion of the second dielectric layer remains after a portion of the first dielectric layer is removed. The retained second dielectric layer rises above the first floating gate layer. A second floating gate layer is formed covering the first dielectric layer, the second dielectric layer and the first floating gate layer. Another chemical-mechanical polishing operation is conducted to planarize the second floating gate layer and expose the second dielectric layer. The first floating gate layer and the second floating gate layer together constitute the floating gate of a flash memory unit. The floating gate of each memory unit is isolated from the others through the shallow trench isolation regions.

The method of forming the floating gate of a flash memory unit according to this invention is capable of preventing alignment deviation resulting from using a conventional photolithographic process to form the floating gate. Moreover, the method of this invention removes one photolithographic processing step and the floating gate is self-aligned. Furthermore, the method is largely unaffected by a narrowing of line width and aligning limitations associated with a photolithographic process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
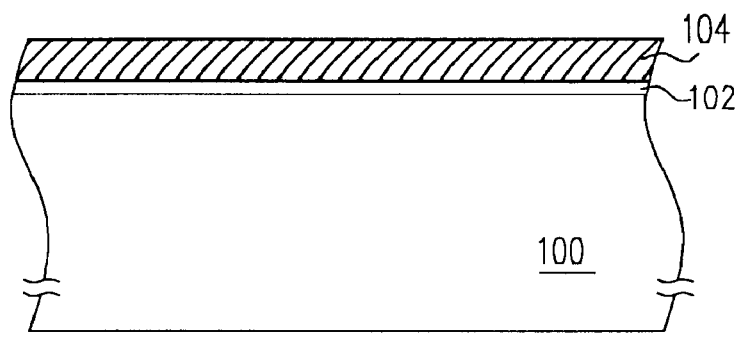
FIGS. 1A through 1F are cross-sectional views showing the progression of steps for forming the floating gate of a conventional flash memory.
Figure 1B:
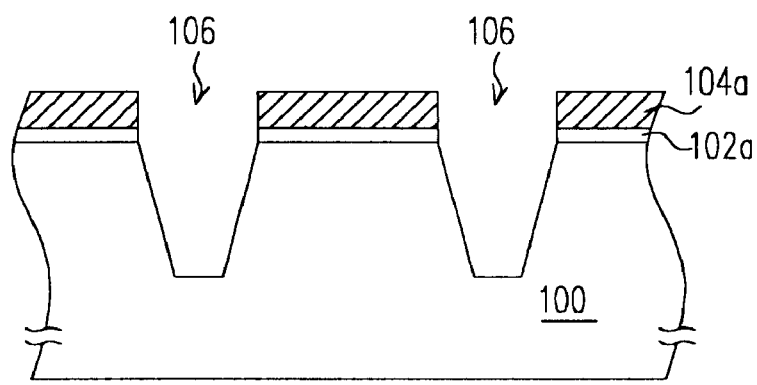
Figure 1C:
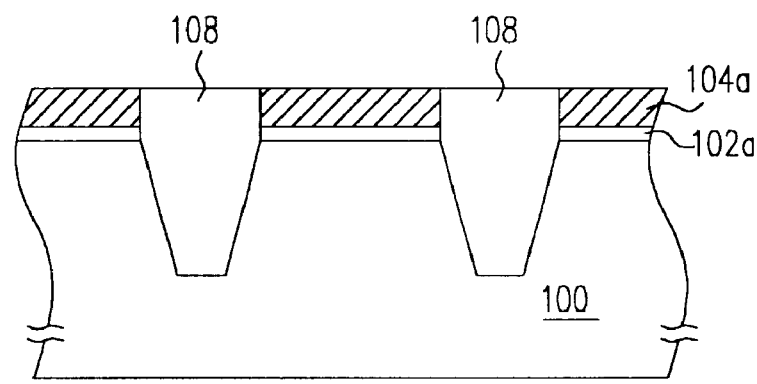
Figure 1D:
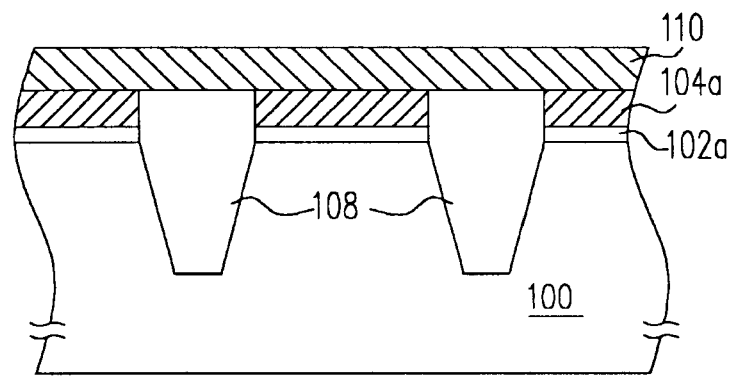
Figure 1E:
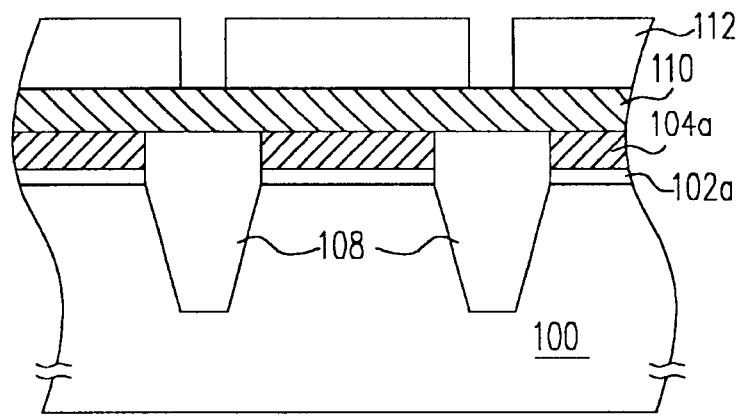
Figure 1F:
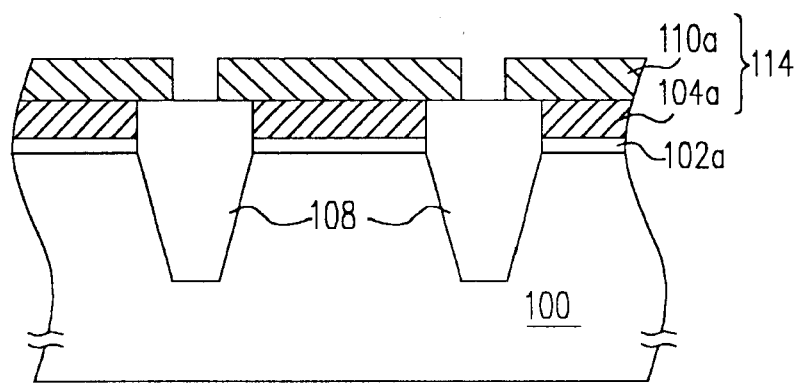

Reference will now be made in detail to the present preferred embodiments of the invention, examples of which are illustrated in the accompanying drawings. Wherever possible, the same reference numbers are used in the drawings and the description to refer to the same or like parts.

Figure 2A:
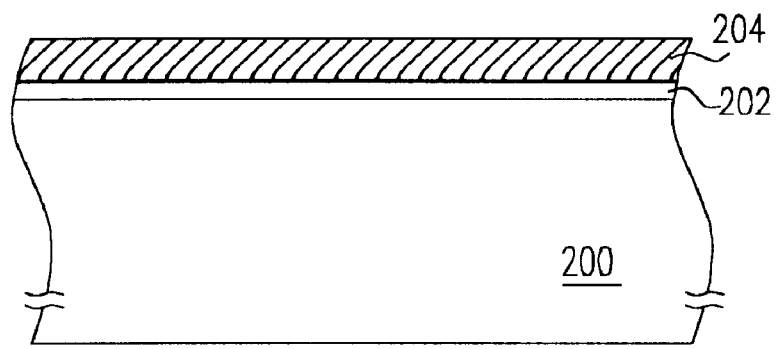
FIGS. 2A through 2H are cross-sectional views showing the progression of steps for forming the floating gate of a flash memory unit according to one preferred embodiment of this invention.

FIGS. 2A through 2H are cross-sectional views showing the progression of steps for forming the floating gate of a flash memory unit according to one preferred embodiment of this invention. A substrate 200 having a tunnel oxide layer 202 and a first floating gate layer 204 thereon is provided as shown in FIG. 2A. The tunnel oxide layer 202 is formed, for example, by thermal oxidation. The first floating gate layer 204, for example, can be a polysilicon layer having a thickness between about 200 Å to 1500 Å.

Figure 2B:
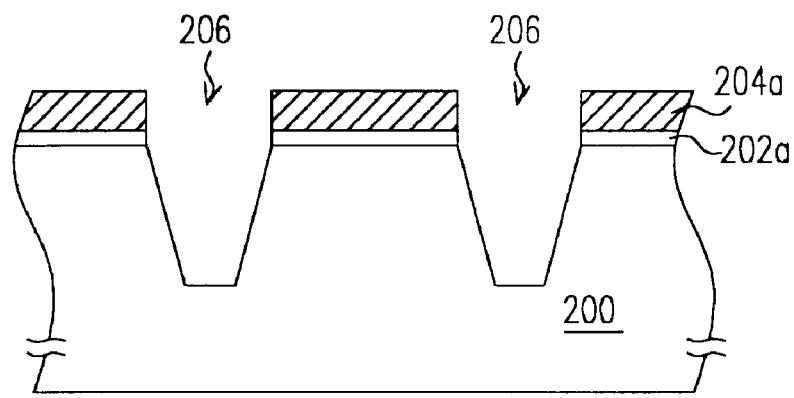

As shown in FIG. 2B, the first floating gate layer 204 and the tunnel oxide layer 202 are patterned to form an opening 206 in the substrate 200, a patterned first floating layer 204a and a patterned tunnel oxide layer 202a. The first floating gate layer 204, the tunnel oxide layer 202 and the substrate 200 are patterned, for example, by conducting photolithographic and etching processes.

Figure 2C:
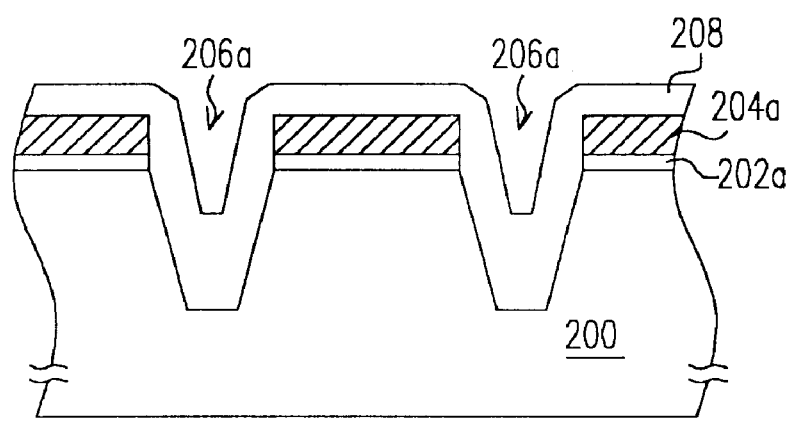

As shown in FIG. 2C, a first dielectric layer 208 is formed over the first floating gate layer 204a but only partially filling the opening 206. The first dielectric layer 208 is formed, for example, by conducting a low-pressure chemical vapor deposition (LPCVD). The first dielectric layer 208 having a thickness between about 100 Å to 7000 Å is made from a material, for example, silicon oxide or tetra-ethyl-ortho-silicate (TEOS)-silicon oxide. Since the opening 206 is not completely filled by the first dielectric layer 208, a smaller opening 206a still exists in the first dielectric layer 208.

Figure 2D:
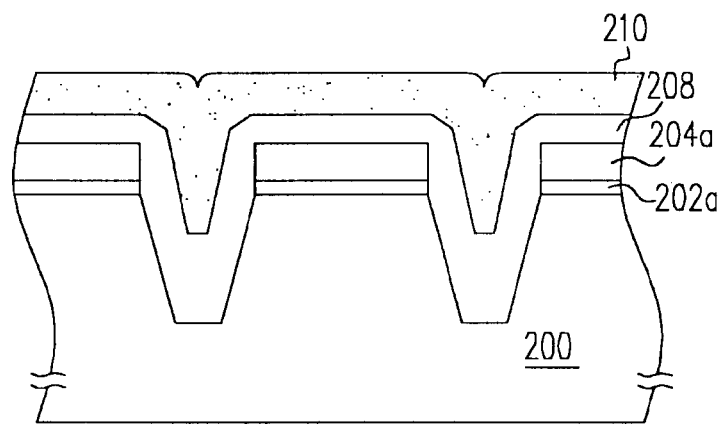

As shown in FIG. 2D, a second dielectric layer 210 is formed over the first dielectric layer 208. The second dielectric layer 210 completely fills the opening 206a. Material constituting the second dielectric layer 210 must be selected such that the etching selectively ratio between the first dielectric layer 208 and the second dielectric layer 210 must be large. In other words, the second dielectric layer 210 must have an etching rate smaller than the first dielectric layer 208. In this embodiment, the second dielectric layer 210 is a silicon nitride layer and has a thickness between about 100 Å to 7000 Å, for example.

Figure 2E:
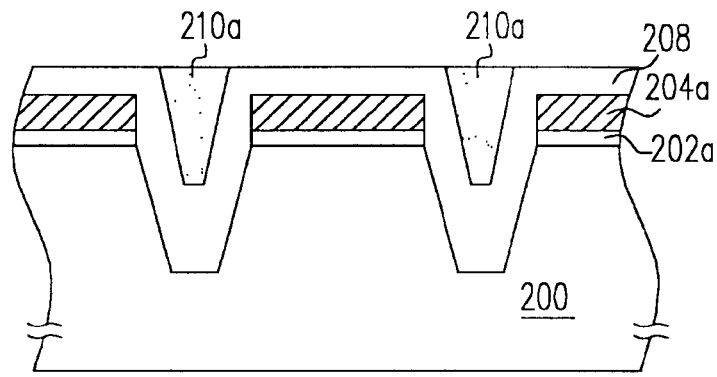

As shown in FIG. 2E, the second dielectric layer 210 is planarized to expose the first dielectric layer 208. The second dielectric layer 210 is planarized, for example, by conducting a chemical-mechanical polishing (CMP).

Figure 2F:
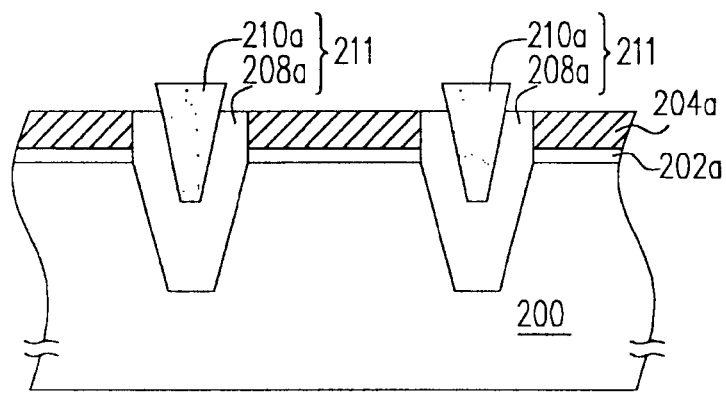

As shown in FIG. 2F, a portion of the first dielectric layer 208 is removed to expose the first floating gate layer 204a and form a shallow trench isolation region 211. The first dielectric layer 208a surrounds the shallow trench isolation region 211 while the second dielectric layer 210a occupies the central portion of the shallow trench isolation region 211.

In this embodiment, the first dielectric layer 208 is removed, for example, by wet etching. Since the second dielectric layer 210 has an etching rate lower than the etching rate of the first dielectric layer 208, the second dielectric layer 210a is retained after a portion of the first dielectric layer 208 is removed. The retained second dielectric layer 210a rises higher than the first floating gate layer 204a. In general, the second dielectric layer 210a is higher than the first floating gate layer 204a by between 100 Å to 3000 Å.

According to this invention, the shallow trench isolation region 211 is formed by first depositing material over the opening 206 to form the first dielectric layer 208 en and then depositing material over the first dielectric layer 208 to form the second dielectric layer 210 and fill up the opening 206. Due to the special characteristic of material deposition, the second dielectric layer 210a is aligned accurately within the central core of the shallow trench isolation region 211.

Figure 2G:
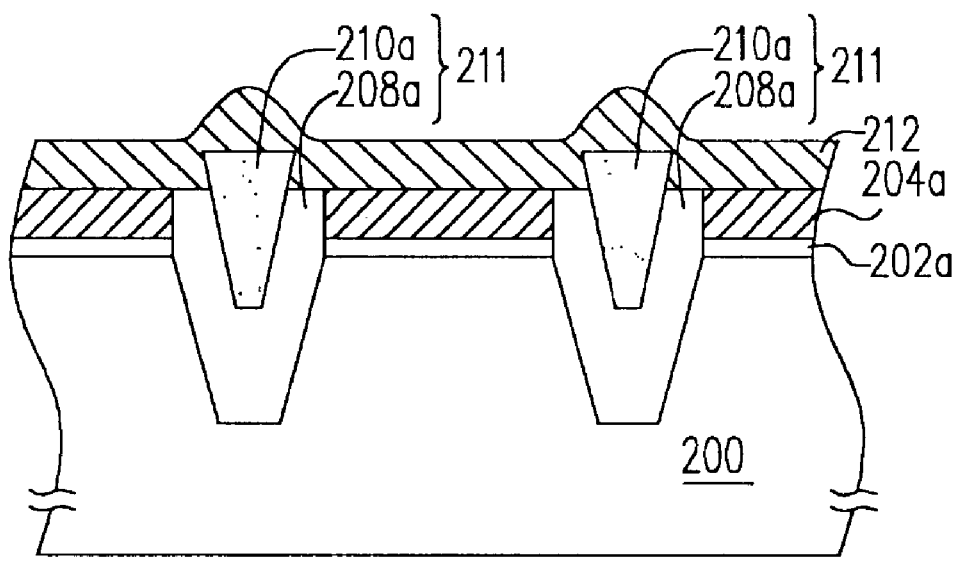

As shown in FIG. 2G, a second floating gate layer 212 is formed over the first floating gate layer 204a and the shallow trench isolation layer 212. The second floating gate layer 212 having a thickness of between about 700 Å to 3000 Å is a polysilicon layer, for example.

Figure 2H:
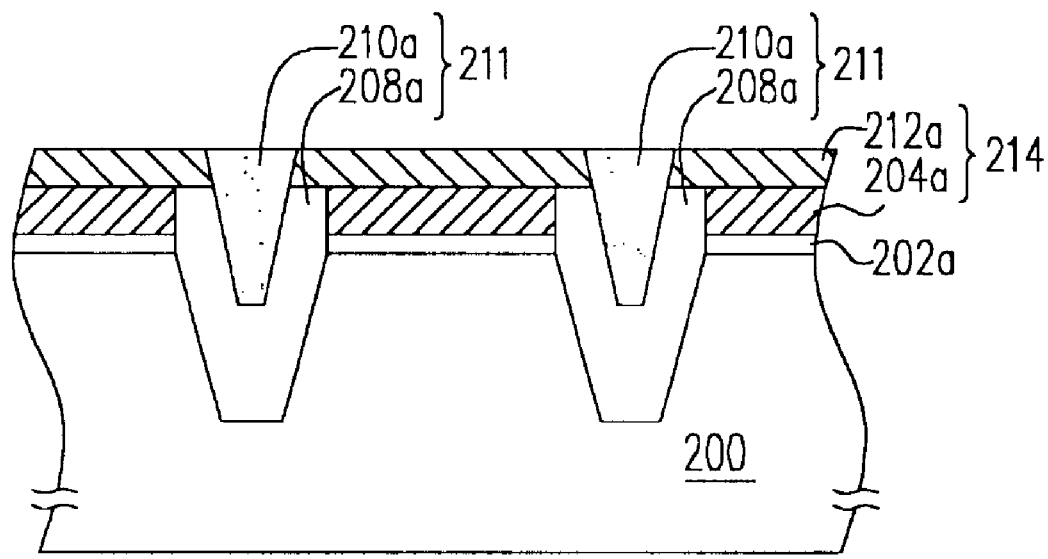

As shown in FIG. 2H, the second floating gate layer 212 is planarized to expose the second dielectric layer 210a in the central portion of the shallow trench isolation region 211. The second floating gate layer 212 is planarized, for example, by conducting a chemical-mechanical polishing (CMP). The first floating gate layer 204a and the second floating gate layer 212a together constitute the floating gate 214 of a flash memory unit. The floating gate 214 in each memory unit is isolated from the others through the shallow trench isolation regions 211.

The floating gates 214 of each flash memory unit are isolated from each other through the shallow trench isolation regions 211. The shallow trench isolation region 211 is formed by depositing dielectric material over the opening 206 to form a conformal layer, that is the first dielectric layer 208, and then depositing dielectric material over the first dielectric layer 208 to fill the opening 206. Due to the characteristics of a deposition process, the second dielectric layer 210a is accurately formed at the central portion of the shallow trench isolation region 211. In addition, utilizing the shallow trench isolation regions 211 and chemical-mechanical polishing operations, the second floating gate layer 212a is formed between the shallow trench isolation regions 211 and automatically aligned with the first floating gate layer 204a.

In conclusion, major advantages of this invention include:
1. The method prevents the emergence of alignment problem due to the deployment of conventional photolithographic and etching processes to form the floating gate.
2. The method reduces the number of photolithographic process by one. Moreover, the floating gate is automatically aligned.
3. Even if dimensions of device are reduced, production is largely unaffected by line width and alignment accuracy limiting photolithographic and etching processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming the floating gate of a flash memory unit, comprising the steps of:

forming a tunnel oxide layer and a first floating gate layer over a substrate;

patterning the first floating gate layer, the tunnel oxide layer and the substrate to form an opening;

forming a first dielectric layer covering an interior surface of the opening and the first floating gate layer but without completely filling the opening;

forming a second dielectric layer over the first floating gate layer and the first dielectric layer so that the opening is completely filled;

planarizing the second dielectric layer to expose the first dielectric layer that was formed over the first floating gate layer;

removing a portion of the first dielectric layer to expose the first floating gate layer and to make the second dielectric layer raise above a top surface of a remaining first dielectric layer;

forming a second floating gate layer that covers the first dielectric layer, the second dielectric layer and the first floating gate layer; and planarizing the second floating gate layer to expose the second dielectric layer, so that a remaining second floating gate layer covers the first floating gate layer as well as extending over the remained first dielectric layer.

2. The method of claim 1, wherein the first dielectric layer has an etching rate greater than the second dielectric layer.

3. The method of claim 1, wherein material constituting the first dielectric layer includes silicon oxide.

4. The method of claim 1, wherein material constituting the first dielectric layer includes tetra-ethyl-ortho-silicate (TEOS).

5. The method of claim 1, wherein the step of forming the first dielectric layer includes conducting a low-pressure chemical vapor deposition.

6. The method of claim 1, wherein material constituting the second dielectric layer includes silicon nitride.

7. The method of claim 1, wherein material constituting the first floating gate layer includes polysilicon.

8. The method of claim 1, wherein material constituting the second floating gate layer includes polysilicon.

9. The method of claim 1, wherein the step of planarizing the second dielectric layer includes conducting a chemical-mechanical polishing operation.

10. The method of claim 1, wherein the step of planarizing the second floating gate layer includes conducting a chemical-mechanical polishing operation.

11. The method of claim 1, wherein the step of removing a portion of the first dielectric layer includes wet etching.

* * * * *